(12) United States Patent
Hikita et al.

(10) Patent No.: US 6,635,512 B1
(45) Date of Patent: Oct. 21, 2003

(54) METHOD OF PRODUCING A SEMICONDUCTOR DEVICE BY DIVIDING A SEMICONDUCTOR WAFER INTO SEPARATE PIECES OF SEMICONDUCTOR CHIPS

(75) Inventors: Junichi Hikita, Kyoto (JP); Ikuo Yoshida, Kyoto (JP); Kazuhide Ino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/704,563

(22) Filed: Nov. 3, 2000

(30) Foreign Application Priority Data

Nov. 4, 1999 (JP) ............................................ 11-314086
Nov. 4, 1999 (JP) ............................................ 11-314087
Nov. 4, 1999 (JP) ............................................ 11-314088

(51) Int. Cl.⁷ ........................... H01L 21/44; B24B 41/06
(52) U.S. Cl. ......................................... 438/113; 451/15
(58) Field of Search ................................. 438/106, 107, 438/108, 110, 113, 114; 451/15, 286; 148/DIG. 28; 257/506

(56) References Cited

U.S. PATENT DOCUMENTS

| | | | | |
|---|---|---|---|---|
| 5,605,489 A | * | 2/1997 | Gale et al. | 148/DIG. 28 |
| 5,770,884 A | * | 6/1998 | Pogge et al. | 257/506 |
| 5,961,369 A | * | 10/1999 | Bartels et al. | 451/5 |
| 6,010,538 A | * | 1/2000 | Sun et al. | 156/345 |
| 6,340,326 B1 | * | 1/2002 | Kistler et al. | 451/286 |

* cited by examiner

Primary Examiner—William David Coleman
(74) Attorney, Agent, or Firm—Rabin & Berdo, P.C.

(57) ABSTRACT

A method of producing a semiconductor device by dividing a semiconductor wafer into separate pieces of semiconductor chips. This method includes forming a groove with a pattern according to an outer contour of a desired semiconductor chip, holding the semiconductor wafer by a wafer holding mechanism, grinding a back surface of the semiconductor wafer held by the wafer holding mechanism detecting opening of a bottom face of the groove during the back surface grinding process to determine timing for finishing the back surface grinding. The opening of the groove can be detected by means of a light sensor for detecting light passing through the groove or a microwave sensor for detecting a microwave passing through the groove. In addition, it is possible to suck air inside the groove so as to detect the opening of the groove by a pressure rise in the air inside the groove.

5 Claims, 8 Drawing Sheets

METHOD OF PRODUCING A SEMICONDUCTOR DEVICE BY DIVIDING A SEMICONDUCTOR WAFER INTO SEPARATE PIECES OF SEMICONDUCTOR CHIPS

BACKGROUND OF THE INVENTION

1. Field of the Invention

The present invention relates to a method of producing a semiconductor device by cutting out separate pieces of semiconductor chips from a semiconductor wafer, and a grinding machine for use in the method of producing the semiconductor device.

2. Description of Related Art

Production processes of a thin semiconductor device such as a semiconductor device for IC chips include a grinding process for grinding an inactive surface (back surface) of a semiconductor wafer with a grinder. This grinding process is carried out prior to a dicing process for dicing a semiconductor wafer to divide it into semiconductor chips. This is because if the grinding process is carried out after the dicing process, the back surface of each semiconductor chip has to be separately ground, which causes the grinding process to take labor.

However, cutting such a thin semiconductor wafer with a dicing saw causes cracking of the semiconductor wafer and chipping of semiconductor chips. For this reason, a semiconductor wafer cannot be made thinner than a limit thickness, which is about 50 μm, by grinding prior to the dicing process.

Accordingly, carrying out the dicing process prior to the process of grinding the back surface of the semiconductor wafer has been recently proposed. That is, after an active surface of a semiconductor wafer is cut with a dicing saw so as to form grooves, a tape for protecting the surface is stuck to the surface of the semiconductor wafer. In this condition, the back surface of the semiconductor wafer is ground by a grinder. This back surface grinding is continued until the surface of the semiconductor wafer subject to grinding (back surface) by the grinder reaches the grooves, when thinned separate pieces of semiconductor chips can be obtained.

The arrival of the surface subject to grinding at the grooves may be detectable based on, for example, a change in a torque current flowing in a motor for driving the grinder. That is, when the surface subject to grinding reaches the grooves, the contact area between the back surface of the semiconductor wafer and the grinder decreases, causing the torque applied from the back surface of the semiconductor to the grinder to decrease. As a result, the quantity of the torque current flowing in the motor for driving the grinder lessens, according to which the arrival of the surface subject to grinding at the grooves maybe detected. Additionally, when grinding by using a chemical is performed as in the case of the CMP (Chemical-Mechanical Polishing) process, the arrival of the surface subject to grinding at the grooves may be detected based on a change in the pH level of the chemical.

However, since the change in the torque current or that in the pH level due to the arrival of the surface subject to grinding at the grooves is so little that it is impossible for both of the above-mentioned methods to precisely detect that the surface subject to grinding has reached the grooves. Accordingly, terminating the back surface grinding in response to the detection of the arrival of the surface subject to grinding at the grooves by such methods tends to lead to insufficient or excessive grinding, causing the produced semiconductor chips to scatter in the thickness.

In addition, as another method for detecting the arrival of the surface subject to grinding at the grooves, the method as shown in FIG. 10 is also possible. In this method, a gaugel G is pressed against the surface of a semiconductor wafer W subject to grinding to measure (monitor) the thickness between a wafer stage 91 on which the semiconductor wafer W is mounted and the surface of the semiconductor wafer W subject to grinding so as to determine that the surface subject to grinding has reached the grooves when the thickness of the semiconductor wafer W has become a predetermined value. However, due to unevenness in thickness of a surface protection tape 92 stuck to the surface of the semiconductor wafer W, the results of the measurement by the gauge G include a significant margin of error. Accordingly, it is impossible to obtain a desired thickness e.g. 50 μm of the semiconductor chips with high accuracy.

SUMMARY OF THE INVENTION

It is an object of this invention to provide a method of producing a semiconductor device capable of preventing occurrence of cracking or chipping in semiconductor chips as well as suppressing variation in the thickness of the semiconductor chips, and a grinding machine for use in the production method of this semiconductor device.

The method of producing a semiconductor device according to this invention comprises: a groove forming process for forming a groove with a pattern according to an outer contour of a desired semiconductor chip in a front surface of a semiconductor wafer; a wafer holding process following the groove forming process for holding, with a wafer holding mechanism, the front surface of the semiconductor wafer, for instance, by sticking a wafer holding mechanism to the front surface of the semiconductor wafer; a back surface grinding process for grinding a back surface of the semiconductor wafer being held by the wafer holding mechanism by a grinder; and a finish timing determining process for detecting opening of a bottom face of the groove during the back surface grinding process and determining the timing for finishing the back surface grinding process based on the detection.

The opening of the bottom face of the groove (penetration) may be detected by an electromagnetic wave sensor for detecting electromagnetic waves including light or microwaves that pass through the groove. In addition, the method may include a back surface grinding process for grinding the back surface of a semiconductor wafer being held by the wafer holding mechanism, an air sucking process for sucking air inside the groove during the back surface grinding process, and an air pressure monitoring process for detecting and monitoring air pressure inside the groove during the air sucking process, thereby detecting the penetration of the groove based on a change in the air pressure detected during the air pressure monitoring process.

The grinding machine for carrying out the production method of this invention may be one which comprises a wafer holding mechanism for holding the front surface of the semiconductor wafer, for example, by adhering to the front surface of the semiconductor wafer, a grinder for grinding the back surface of the semiconductor wafer being held by the wafer holding mechanism, a penetration detecting mechanism for detecting opening of a bottom face of the groove formed in the semiconductor wafer being held by the wafer holding mechanism, and a control section for determining the timing for finishing the process of grinding the back surface of the semiconductor wafer by the grinder, which determination being made based on-an output from the penetration detecting mechanism.

The penetration detection mechanism may include an electromagnetic wave sensor for detecting an electromagnetic wave such as light or microwave that passes through the groove.

According to this invention, by grinding the back surface of a semiconductor wafer after forming grooves in the semiconductor wafer by dicing, the semiconductor wafer is divided into individual semiconductor chips. Accordingly, cracking or chipping of the semiconductor chips does not occur during the dicing, and extremely thin semiconductor chips being 50 μm or less in thickness can be produced in good order.

Meanwhile, the timing for finishing the back grinding of the semiconductor wafer is determined, for example, based on an output of an electromagnetic wave sensor such as a light sensor.

A light sensor may be disposed in the wafer holding mechanism or in the grinder so as to detect light, which is directed from a light source disposed in the grinder or the wafer holding mechanism and passes through the groove. In this case, when the surface of the semiconductor wafer subject to the grinding by the grinder reaches the groove and the groove comes into a state of penetrating the semiconductor wafer from the surface to the back surface thereof, the light from the light source passes through the groove and enters into the light sensor. Accordingly, the timing at which the light sensor detects the light from the light source corresponds to the timing at which the surface of the semiconductor wafer subject to grinding reaches the groove. Based on the detection of the light that has passed through the groove by the light sensor, the timing for finishing the back surface grinding of the semiconductor wafer is determined so that the back surface grinding of the semiconductor wafer can be always finished with almost constant timing. The amount of the back surface of the semiconductor wafer to be ground is therefore prevented from varying, and the thickness of semiconductor chips obtained from the back surface grinding is kept almost constant.

In this case, it is also possible for the control section to determine the timing such that the back surface grinding of the semiconductor wafer by the grinder is finished at a time when a prescribed time elapses after the light sensor detects the light passing through the groove.

Also, the light sensor may be held by the wafer holding mechanism and of a light emitting/receiving type that directs light toward the groove in the semiconductor wafer held by the wafer holding mechanism while detects light which returns after being reflected by the semiconductor wafer or the grinder.

Due to differences in material and surface configuration between the semiconductor wafer and the grinder, the reflectance of the semiconductor wafer and that of the grinder are different. Accordingly, when the back surface grinding of the semiconductor wafer by the grinder is advanced until the surface of the semiconductor wafer subject to the grinding reaches the groove so that the groove comes into a state of penetrating the semiconductor wafer from its front surface to the back surface, the quantity of the light coming back to the light sensor changes significantly. Here, the timing of the change in the quantity of the light received by the light sensor corresponds to the timing of the arrival of the surface of the semiconductor wafer subject to the grinding at the groove. Accordingly, by determining the timing for finishing the back surface grinding of the semiconductor wafer based on a change in the light quantity received by the light sensor, the back surface grinding of the semiconductor wafer can always be finished with almost constant timing. The amount of the back surface of the semiconductor wafer to be ground is therefore prevented from varying, and the thickness of semiconductor chips obtained from the back surface grinding is kept almost constant.

When using a microwave sensor as the electromagnetic wave sensor, the arrangement may be such that the microwave sensor detects a microwave, which passes through the groove formed in the semiconductor wafer after being directed toward between the grinder and the back surface of the semiconductor wafer held by the wafer holding mechanism from a microwave oscillator which is provided in association with the grinder. In this case, when the surface of the semiconductor wafer subject to the grinding by the grinder reaches the groove and the groove comes into a state of penetrating the semiconductor wafer from its front surface to the back surface, the microwave directed toward between the grinder and the back surface of the semiconductor wafer passes through the groove and reaches the microwave sensor. Here, the timing of the detection of the microwave by the microwave sensor corresponds to the timing of the arrival of the surface of the semiconductor wafer subject to grinding at the groove. Therefore, by determining the timing for finishing the back surface grinding of the semiconductor wafer based on the detection of the microwave having passed through the groove by the microwave sensor, the back surface grinding of the semiconductor wafer can always be finished with almost constant timing. The amount of the back surface of the semiconductor wafer to be ground is therefore prevented from varying, and the thickness of semiconductor chips obtained from the back surface grinding is kept almost constant.

It is also possible to locate the microwave sensor in either one of the wafer holding mechanism and the grinder and to locate the microwave oscillator in the other one of the wafer holding mechanism and the grinder so that the microwave sensor detects the microwave that is directed from the microwave oscillator and passes through the groove formed in the semiconductor wafer held by the wafer holding mechanism.

In addition, it is possible for the control section to determine the timing such that the back surface grinding of the semiconductor wafer by the grinder is finished when a prescribed time elapses after the microwave sensor detects the microwave passing through the groove.

The penetration detecting mechanism may include an air sucking mechanism for sucking air inside the groove formed in the semiconductor wafer held by the wafer holding mechanism and an air pressure detecting mechanism for detecting the air pressure inside the groove. In this case, the control section should preferably determine the timing for finishing the back surface grinding of the semiconductor wafer by the grinder based on an output from the air pressure detecting mechanism.

For instance, the air sucking mechanism may comprise an air inlet formed in the wafer holding surface (the surface contacting with the front surface of the semiconductor wafer) of the wafer holding mechanism, a suction pipe communicating with the air inlet, and a vacuum source connected to the suction pipe. In this case, in a state where the groove has not appeared in the back surface of the semiconductor wafer, the groove on the side of the back surface of the wafer are closed and the air pressure inside the groove is therefore relatively low. On the other hand, in a state where the back surface grinding of the semiconductor wafer has been advanced so that the groove appears in the back surface of the semiconductor wafer, the groove penetrates the semiconductor wafer from its surface to the back surface. Thus, air enters from the side of the back surface of the semiconductor wafer into the groove, by which the air pressure inside the groove suddenly increases.

Accordingly, by monitoring the air pressure inside the groove, especially changes thereof, the arrival of 1S the surface of the semiconductor wafer subject to grinding at the groove can be precisely detected. Thus, by determining the timing for finishing the back surface grinding of the semiconductor wafer based on the detections the back surface grinding of the semiconductor wafer can always be finished when the semiconductor wafer has been ground in an approximately constant amount, and therefore the thickness of semiconductor chips obtained from the back surface grinding is kept almost constant.

In addition, it is possible for the control section to determine the timing such that the back surface grinding of the semiconductor wafer by the grinder is finished when a predetermined time elapses after the detection of a change in the air pressure inside the groove.

The foregoing and further objects, features and effects of the present invention will be apparent from the following description of embodiments referring to the accompanying drawings.

DESCRIPTION OF THE PREFERRED EMBODIMENTS

Figure 1A:
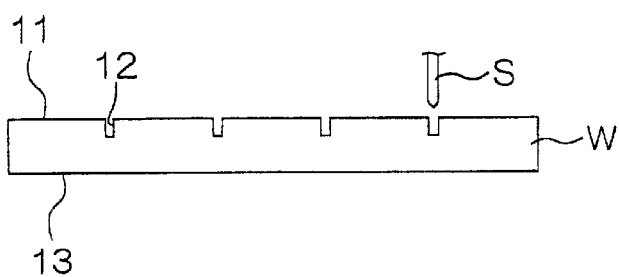
FIGS. 1A–1C are diagrammatical sectional views for illustrating a method of producing a semiconductor device according to a first embodiment of this invention.
Figure 1B:
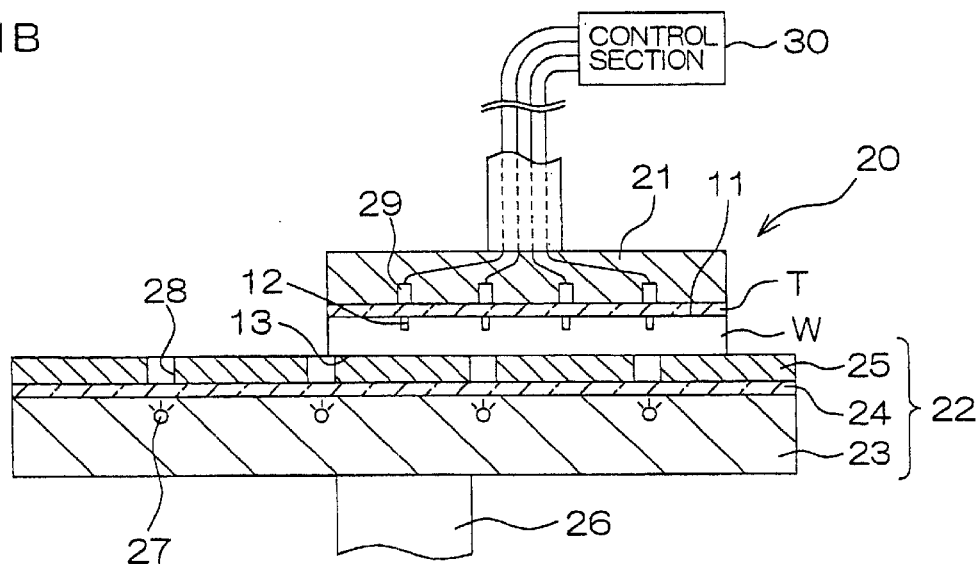
Figure 1C:
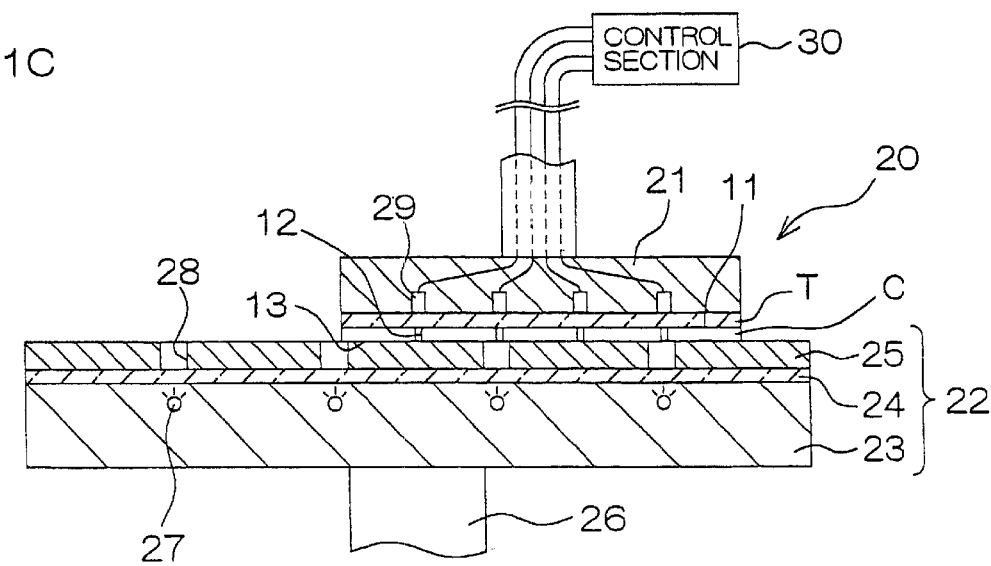

FIGS. 1A–1C are diagrammatical sectional views for illustrating a method of producing a semiconductor device according to a first embodiment of this invention, and show in sequence a process of cutting out semiconductor chips C from a semiconductor wafer W. At first, as shown in FIG. 1A, a front surface 11 of a semiconductor wafer W is cut by using a dicing saw S so as to form a pattern of grooves 12 according to a contour of a semiconductor chip C. The depth of the grooves 12 is determined to be smaller than the thickness of the semiconductor wafer W and, for example, somewhat larger than a desired thickness of the semiconductor chips C. The front surface 11 of the semiconductor wafer W refers to a surface (active surface) on the side of an active surface area in which devices such as transistors and resistors are formed.

The semiconductor wafer W having been provided with the grooves 12 is brought in a grinding machine 20 for grinding the back surface (inactive surface) 13 opposite to the front surface 11. As shown in FIG. 1B, the grinding machine 20 includes a wafer head 21 rotatable about the vertical axis line and a grinder 22 opposedly disposed below the wafer head 21.

The grinder 22 is provided with an approximately circular surface plate 23 larger than the semiconductor wafer W in plan view, a transparent plate 24 which is made of transparent material and fixed in the upper surface of the surface plate 23, and a grinding pad 25 fixed in the upper surface of the transparent plate 24, and is supported in a rotatable manner by a rotational axis 26 provided substantially along the vertical line.

In the upper surface of the surface plate 23, a prescribed number (one or plural number) of light sources 27 are disposed facing the transparent plate 24. Light passage holes 28 are formed in the grinding pad 25 at positions corresponding to those of the light sources 27. Light from the light sources 27 passes through the transparent plate 24 and the light passage holes 28 so as to be directed from the upper surface (grinding surface) of the grinding pad 25. On the other hand, in the bottom surface of the wafer head 21, a prescribed number (one or plural number) of light detecting devices 29 for detecting the light from the light sources 27 are disposed.

Output signals of this light detecting devices 29 are inputted into a control section 30 comprising a microcomputer and the like. The control section 30 controls movement of each part of the grinding machine 20 including the rotation of the wafer head 21 and the grinder 22 based on signals inputted thereto from the light detecting devices 29 and the like.

The semiconductor wafer W brought in the grinding machine 20 is held by the wafer head 21 through a double coated tape T made of transparent material. More specifically, one side of the double coated tape T is stuck to the front surface 11 of the semiconductor wafer W, and the other side of the double coated tape T is stuck to the bottom surface of the wafer head 21 of the grinding machine 20. Accordingly, the semiconductor wafer W is held by the wafer head 21 with its back surface 13 being directed downward.

When the semiconductor wafer W is held by the wafer head 21 in such a manner, the wafer head 21 receives downward load so that the back surface 13 of the semiconductor wafer W is pressed against the upper surface (grinding surface) of the grinding pad 25. By rotating the wafer head 21 as well as rotationally driving the grinder 22 in this condition, the back surface 13 of the semiconductor wafer W is ground.

When the back surface grinding of the semiconductor wafer W is advanced until the surface of the semiconductor wafer W subject to the grinding by the grinding pad 25 (grinder 22) reaches the grooves 12 and the grooves 12 appear in the back surface 13 of the semiconductor wafer W as shown in FIG. C, the grooves 12 come into a state of penetrating the semiconductor wafer W from its surface to the back surface. That is, the bottom faces of the grooves 12 are opened. When the grooves 12 traverse the light passage holes 28 of the grinding pad 25, the light from the light sources 27 passing through the light passage holes 28 enters into the grooves 12. The light that has entered into the grooves 12 passes through the grooves 12 so as to enter into the double coated tape T, and after passing through the double coated tape T, the light enters into the light detecting devices 29 disposed in the bottom surface of the wafer head 21. The light detecting devices 29 then detect the light from the light sources 27, based on which the control section 30 detects that the surface of the semiconductor wafer W subject to grinding has reached the grooves 12.

Subsequently, when a prescribed time elapses after the detection of the arrival of the surface subject to grinding at the grooves 12, the wafer head 21 is raised and then the rotation of the wafer head 21 is stopped together with the rotation of the grinder 22. The back surface grinding process is then finished and separate pieces of the semiconductor chips C with a desired thickness are obtained.

As described so far, according to this embodiment, the light passing through the grooves 12 is detected by the light detecting devices 29 disposed in the wafer head 21, based on which the arrival of the surface of the semiconductor wafer W subject to grinding at the grooves is detected. When a prescribed time elapses after the detection of the arrival of the surface of the semiconductor wafer W subject to grinding at the grooves, the back surface grinding of the semiconductor wafer W by the grinder is terminated. With this arrangement, the back surface grinding of the semiconductor wafer W can always be terminated with almost constant timing. For this reason, variation in the amount of the back surface of the semiconductor wafer W to be ground does not arise, and therefore the thickness of the semiconductor chips C obtained through the back surface grinding can be kept almost constant.

In addition, the back surface 13 of the semiconductor wafer W is ground so as to be divided into the semiconductor chips C after the grooves 12 are cut in the semiconductor wafer W by dicing. This prevents the semiconductor chips C from cracking or chipping during the dicing, and enables production of very thin semiconductor chips with a thickness no more than 50 $\mu$m in good order.

Meanwhile, in the case that all the light detecting devices 29 are arranged so as to be located above the grooves 12 provided in the front surface 11 of the semiconductor wafer W, it is preferable to determine that the surface of the semiconductor wafer W subject to grinding has reached the grooves 12 in response to the detection of the light from the light sources 27 by all of the light detecting devices 29. In this way, the appearance of the whole area of the grooves 12 can be precisely detected, and inconvenience such as the case where the semiconductor wafer W cannot properly be divided into the semiconductor chips C due to insufficient grinding can be surely prevented from arising.

Figure 2:
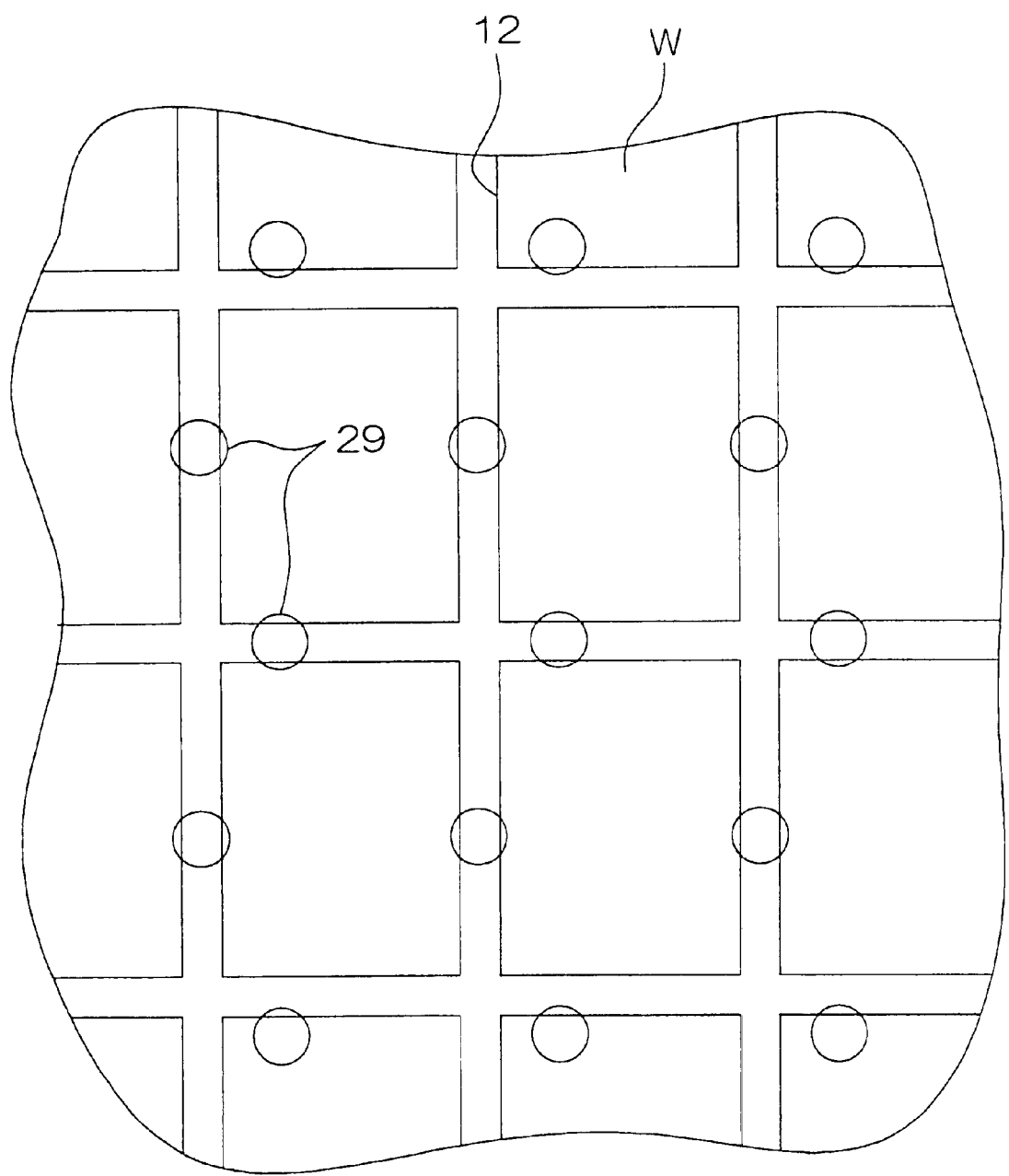
FIG. 2 is an explanatory illustration of a positional relation between grooves and light detecting devices.

However, since the pattern of the grooves cut in the front surface 11 of the semiconductor wafer W varies depending on the size of the desired semiconductor chips, all the light detecting devices 29 disposed in the wafer head 21 are not necessarily located above the grooves. 12. That is, as shown in FIG. 2, it is possible to anticipate that only a part of the prescribed number of the light detecting devices 29 is located above the grooves 12 in the form of a grid. In such a case, the judgment that the surface of the semiconductor wafer W subject to grinding has reached the grooves 12 may be made in response to the detection of the light from the light sources 27 by a predetermined number of light detecting devices 29.

In this embodiment, the light sources 27 are disposed in the grinder 22, and the light detecting devices 29 for detecting the light from the light sources 27 are disposed in the wafer head 21. However, contrary to this arrangement, the light sources 27 may be disposed in the wafer head 21 with the light detecting devices 29 being disposed in the grinder 22.

Figure 3:
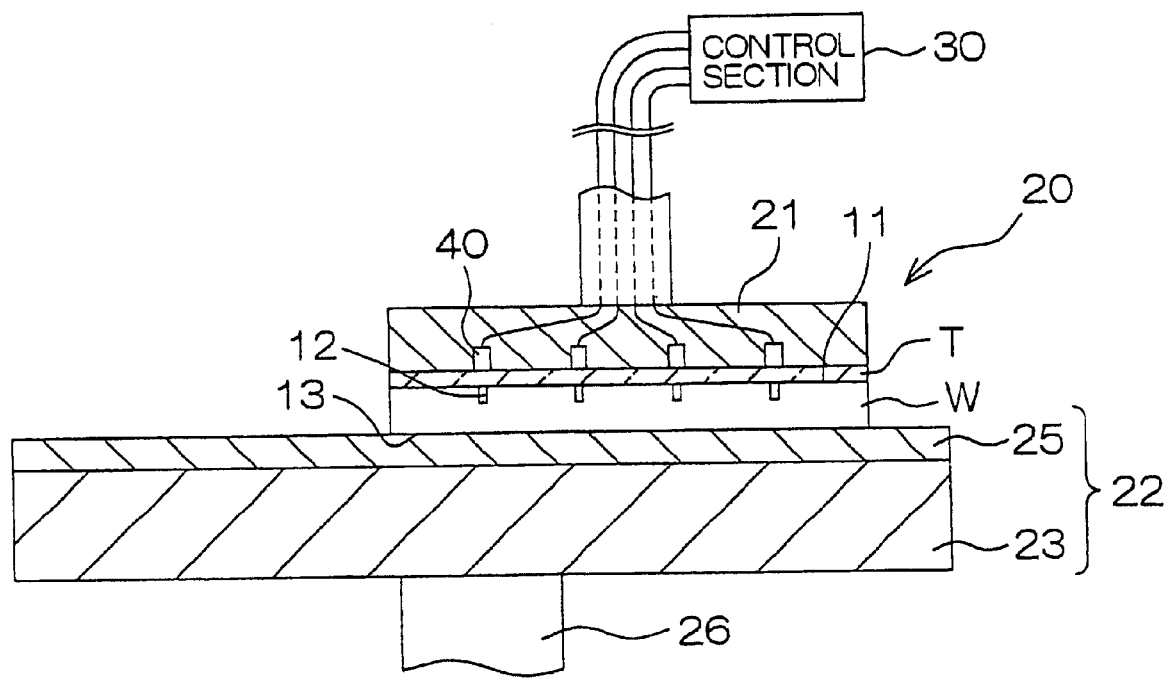
FIG. 3 is a diagrammatical sectional view of another example of the construction of the grinding device.

Additionally, this embodiment may be modified, for example, as shown in FIG. 3. In the arrangement of FIG. 3, light emitting/receiving sensors 40 capable of directing light toward the grooves 12 in the front surface 11 of the semiconductor wafer W as well as detecting the light which returns after being reflected by the semiconductor wafer W or the grinding pad 25 (grinder 22) are disposed in the bottom surface of the wafer head 21. It is also possible to detect that the surface of the semiconductor wafer W subject to grinding has reached the grooves 12 based on the output signals from the light emitting/receiving sensors 40. That is, due to differences in material and surface configuration between the semiconductor wafer W and the grinding pad 25, the reflectance of the semiconductor wafer W differs from that of the grinding pad 25. Accordingly, when the back surface grinding of the semiconductor wafer W by the grinding pad 25 is so advanced that the surface of the semiconductor wafer W subject to grinding reaches the grooves 12, the grooves 12 come into a state of penetrating the semiconductor wafer W from its surface to the back surface. Thus, the quantity of the light entering into the light emitting/receiving sensors 40 changes. Thus, based on the change in the light quantity, the arrival of the surface of the semiconductor wafer W subject to grinding at the grooves 12 can be detected. In the case of adopting this configuration, the transparent plate 24 can be omitted, and it is not necessary to form the light passage holes 28 in the grinding pad 25.

Figure 4A:
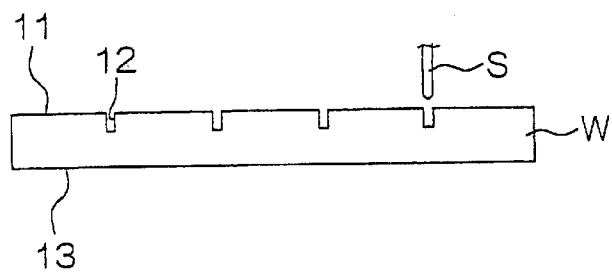
FIGS. 4A–4C are diagrammatical sectional views for illustrating a method of producing a semiconductor device according to a second embodiment of this invention.
Figure 4B:
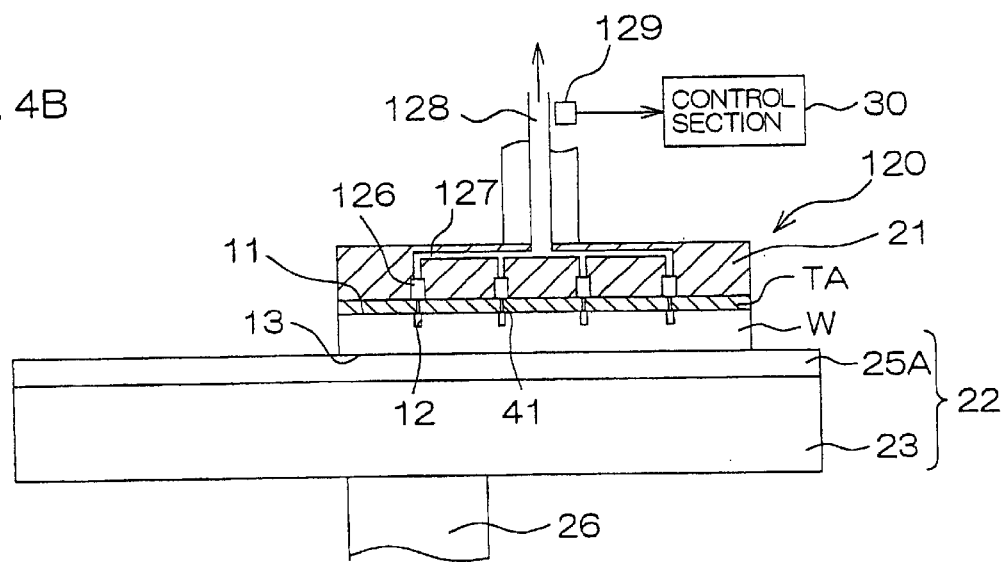
Figure 4C:
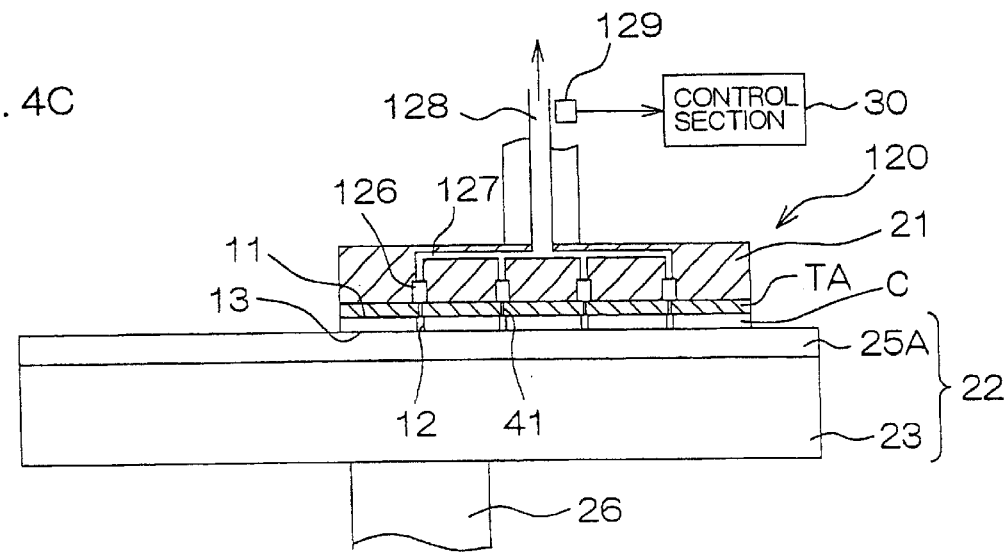

FIGS. 4A–4C are diagrammatical sectional views for illustrating a method of producing a semiconductor device according to a second embodiment of this invention, which shows in sequence a process of cutting out semiconductor chips C from a semiconductor wafer W. In FIGS. 4A–4C, parts corresponding to those in FIGS. 1A–1C are indicated by the same reference alphanumerals as in FIGS. 1A–1C.

Figure 5:
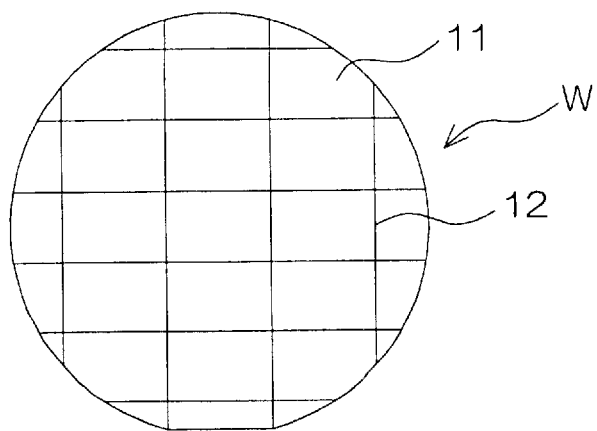
FIG. 5 is a diagrammatical view showing a pattern of grooves formed in a front surface of a semiconductor wafer.

At first, as shown in FIG. 4A, grooves 12 are cut in the front surface 11 (active surface) of the semiconductor wafer W by using a dicing saw S. The depth of the groove 12 is determined to be smaller than the thickness of the semiconductor wafer W, and, for example, somewhat larger than a desired thickness of the semiconductor chips C. The pattern of the grooves 12 is selected according to the contour of the semiconductor chips C so that, for example, in the case of cutting out semiconductor chips which are rectangular in plan view, grooves 12 arranged in the form of a grid as shown in FIG. 5 are formed in the front surface 11 of the semiconductor wafer W.

The semiconductor wafer W having been provided with the grooves 12 is brought in a grinding machine 120 for grinding the back surface (inactive surface) 13 opposite to the front surface 11. The grinding machine 120 includes, as shown in FIG. 4B, a wafer head 21 rotatable about the vertical axis line, and a grinder 22 oppositely disposed below the wafer head 21. The grinder 22 comprises an approximately circular surface plate 23 which is larger than the semiconductor wafer W in plan view, and a grinding pad 25A fixed on the upper surface of the surface plate 23, and is supported by the rotational axis 26 provided almost along the vertical line in a rotatable manner.

Figure 6:
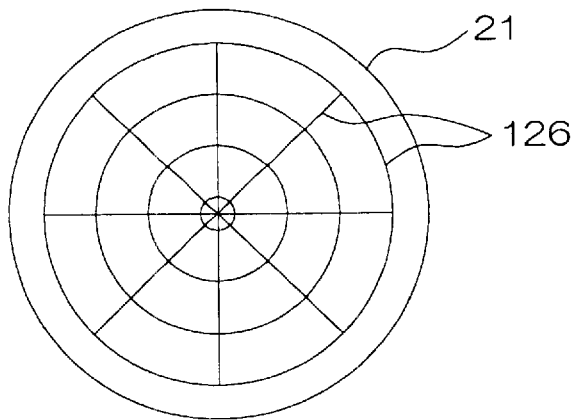
FIG. 6 is an illustration of the bottom surface of a wafer head.
Figure 7:
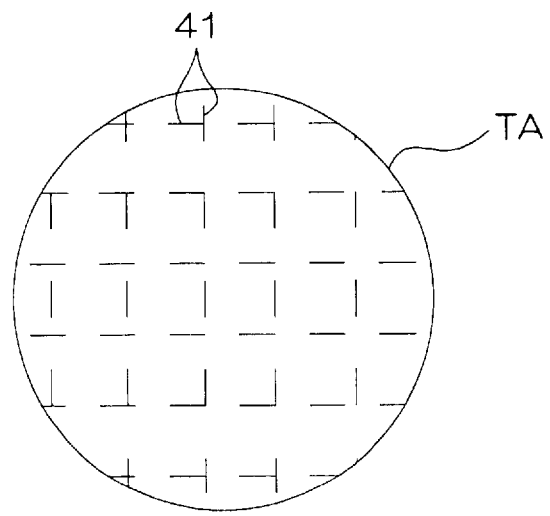
FIG. 7 is a diagrammatical plan view of one arrangement of a chip release prevention tape.

In the bottom surface of the wafer head 21, suction slits 126 are opened being formed concentrically or in a radial pattern as shown in FIG. 6. Suction air passages 127 communicating with the suction slits 126 are formed inside the wafer head 21 and are connected to a vacuum source (not shown) through a suction pipe 128. The vacuum source, suction slits 126, suction air passages 127 and the suction pipe 128 mentioned above constitute an air suction mechanism.

In connection with the suction pipe 128, an air pressure sensor 129 is provided for detecting air pressure inside the groove 12 by detecting air pressure inside the suction pipe 128. Output signals of this air pressure sensor 129 are inputted into a control section 30 that includes a microcomputer and the like. The control section 30 controls movement of each part of the grinding machine 120 such as the rotation of the wafer head 21 and the grinder 22 based on signals inputted thereto from the air pressure sensor 129 and the like.

The semiconductor wafer W brought in the grinding machine 120 is stuck to the wafer head 21 and held by it through a chip release prevention tape TA. In the chip release prevention tape TA, a plural number of slit-like openings 41 are formed in the form of a grid as a whole with a prescribed interval between one another. The both sides of the chip release prevention tape TA are adhesive surfaces, one side of which being stuck to the front surface 11 of the semiconductor wafer W and the other side of which being stuck to the bottom surface of the wafer head 21 of the grinding machine 120, so that the semiconductor wafer W is held by the wafer head 21 with its back surface 13 being directed downward.

With the semiconductor wafer W being held by the wafer head 21 in such a manner, the wafer head 21 is subjected to downward load, and the back surface 13 of the semiconductor wafer W is pressed against the upper surface (grinding surface) of the grinding pad 25A. Then, by rotating the wafer head 21 and rotationally driving the grinder 22 in this condition, the back surface 13 of the semiconductor wafer W is ground. During the back surface grinding of the semiconductor wafer W, the vacuum source that is not shown is constantly kept in the working state, and the output signals of the air pressure sensor 129 (air pressure inside the suction pipe 28) are monitored by the control section 30.

In a halfway state where the grooves 12 have not appeared in the back surface 13 of the semiconductor wafer W (the state shown in FIG. 4B), the air pressure inside the suction pipe 128 is relatively low because the lower parts of the grooves 12 (the sides facing the backsurface 13 of the semiconductor wafer W) are closed.

After that, when the back surface grinding of the semiconductor wafer W is advanced until the surface of the semiconductor wafer W subject to the grinding by the grinding pad 25A (grinder 22) reaches the grooves 12, the grooves 12 appear in the back surface 13 of the semiconductor wafer W as shown in FIG. 4C, and come into a state of penetrating the semiconductor wafer W from its surface to the back surface. Then, air that enters from around the semiconductor wafer W into between the grinding pad 25A and the back surface 13 of the semiconductor wafer W is sucked by the suction pipe 128 through the grooves 12, the openings 41 of the chip release prevention tape TA, and the suction air passages 127, and as a result, the air pressure inside the suction pipe 128 suddenly rises. The control part 30 responds to the change in the air pressure inside the suction pipe 128, determining that the surface of the semiconductor wafer W subject to grinding has reached the grooves 12.

Subsequently, when a prescribed time elapses after the detection of the arrival of the surface of the semiconductor wafer W subject to grinding at the grooves 12 by the control section 30, the wafer head 21 is raised, and then the rotation of the wafer head 21 is stopped together with the rotation of the grinder 22. The back surface grinding, process is thereby terminated, and separate pieces of semiconductor chips C with a desired thickness are obtained.

As described above, in this embodiment, the air pressure inside the suction pipe 128 is always monitored during the back surface grinding so that in response to the detection of a change in the air pressure inside the suction pipe 128, it is judged that the surface of the semiconductor wafer W subject to grinding has reached the grooves 12. This embodiment is arranged such that when a prescribed time elapses after this judgment, the back surface grinding of the semiconductor wafer W by the grinder 22 is terminated. Accordingly, the back surface grinding process can always be terminated when an almost constant amount of the semiconductor wafer W has been ground, thereby allowing the thickness of the semiconductor chips C obtained by the back surface grinding to be approximately constant.

In addition, the back surface 13 of the semiconductor wafer W is ground so as to divide it into the semiconductor chips C after grooves 12 are cut in the semiconductor wafer W by dicing. This prevents generation of cracking or chipping in the semiconductor chips C during the dicing, and enables production of very thin semiconductor chips C with a thickness of 50 μm or less in good order.

In the above embodiment, an arrangement in which a change in the air pressure inside the grooves 12 is detected by detecting a change in the air pressure inside the suction pipe 128 is taken as an example. However, it is also possible to adopt an arrangement for detecting a change in the air pressure inside the suction slits 126 or a change in the air pressure inside the suction air passages 127. That is, any arrangement will be possibly adopted, as long as it can detect a change in the air pressure inside the grooves 12 due to the arrival of the surface of the semiconductor wafer W subject to grinding at the grooves 12.

Figure 8A:
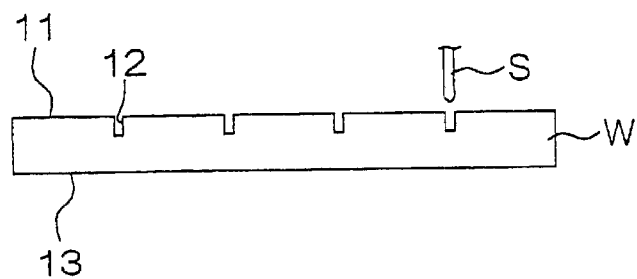
FIGS. 8A–8C are diagrammatical sectional views for illustrating a method of producing a semiconductor device according to a third embodiment of this invention.
Figure 8B:
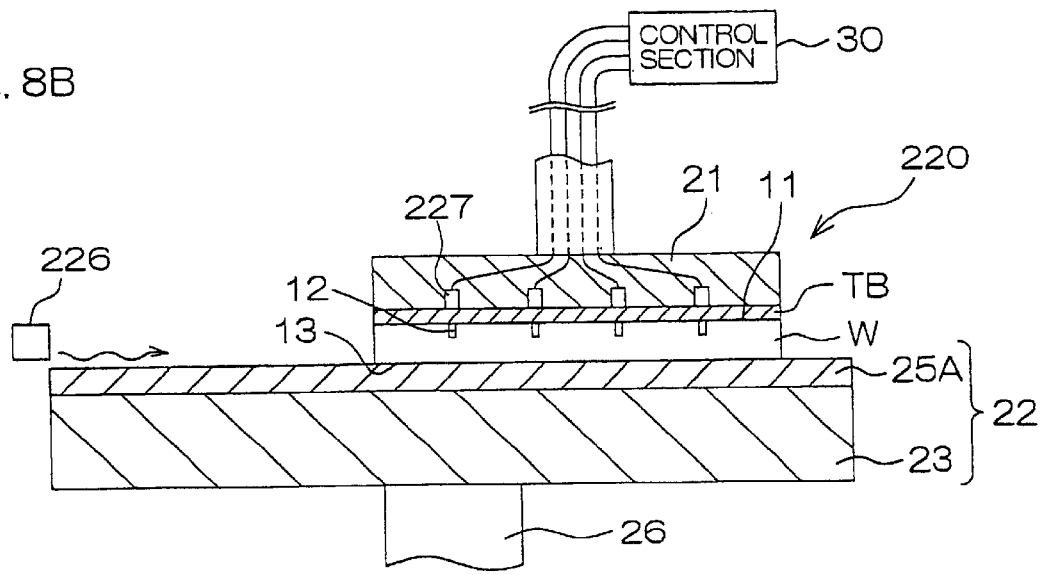
Figure 8C:
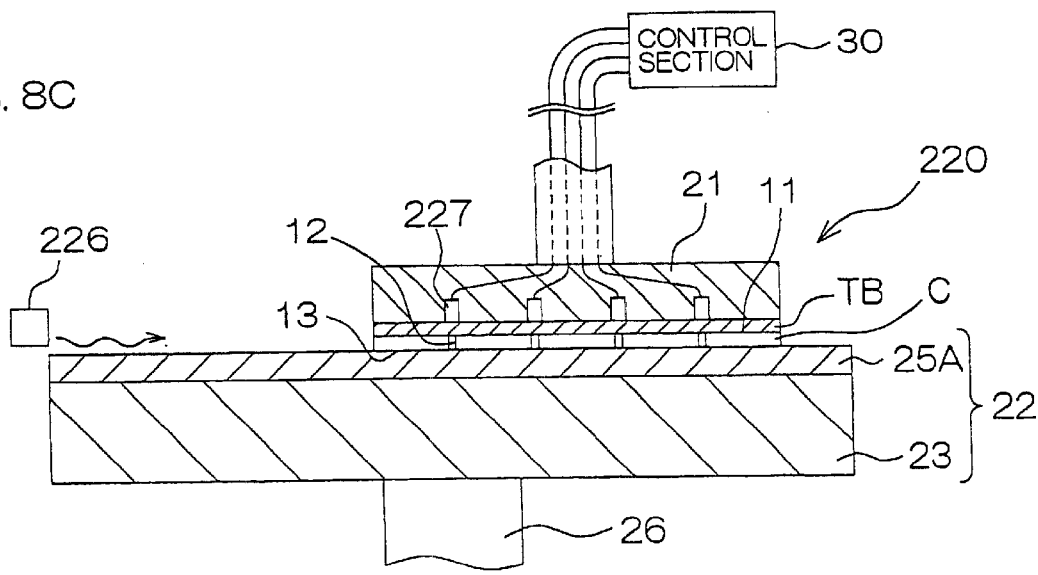

FIGS. 8A–8C are diagrammatical sectional views for illustrating a method of producing a semiconductor device according to a third embodiment of this invention, which shows in sequence the process of cutting out semiconductor chips C from a semiconductor wafer W. In FIGS. 8A–8C, parts corresponding to those in FIGS. 4A–4C are indicated by the same reference alphanumerals as in FIGS. 4A–4C.

At first, as shown in FIG. 8A, a pattern of grooves 12 is cut according to the contour of the semiconductor chips C in the front surface 11 (active surface) of the semiconductor wafer W by using a dicing saw S. The depth of the groove 12 is determined to be smaller than the thickness of the semiconductor wafer W, and, for example, somewhat larger than a desired thickness of the semiconductor chips C.

The semiconductor wafer W with the grooves 12 is brought in a grinding machine 220 for grinding the back surface (inactive surface) 13 opposite to the front surface 11. The grinding machine 220 includes, as shown in FIG. 8B, a wafer head 21 rotatable about the vertical axis line, and a grinder 22 opposedly disposed below the wafer head 21. The grinder 22 comprises an approximately circular surface plate 23 which is larger than the semiconductor wafer W in plan view, and a grinding pad 25A fixed on the upper surface of the surface plate 23, and is supported by the rotational axis 26 provided almost along the vertical line in a rotatable manner.

In connection with the grinder 22, a microwave oscillator 226 for directing microwaves toward the vicinity of the upper surface of,the grinding pad 25A is provided. In the bottom surface of the wafer head 21, a prescribed number (one or plural number) of microwave detecting devices 227 for detecting microwaves directed from the microwave oscillator 226 are disposed. The microwave detecting devices 227 has a construction including parts such as a loop antenna for receiving the microwaves, and a Schottky junction diode for converting the microwaves received by the loop antenna into electrical signals to be outputted.

The output signals of the microwave detecting devices 227 are inputted into a control section 3. The control section 30 controls movement of each part of the grinding machine 220 such as the rotation of the wafer head 21 and the grinder 22 based on signals or the like inputted thereto from the microwave detecting devices 227.

The semiconductor wafer W brought in the grinding machine 220 is stuck to the wafer head 21 so as to be held by it though a double coated tape TB made of a material having permeability to electromagnetic waves. More specifically, one side of the double coated tape TB adheres to the front surface 11 of the semiconductor wafer W, and the other side of the double coated tape TB adheres to the bottom surface of the wafer head 21 of the grinding machine 220. Accordingly, the semiconductor wafer W is held by the wafer head 21 with its back surface 13 being directed downward.

With the semiconductor wafer W being held by the wafer head 21 in such a manner, the wafer head 21 is subjected to downward load, and the back surface 13 of the semiconductor wafer W is pressed against the upper surface (grinding surface) of the grinding pad 25A. Then, by rotating the wafer head 21 and rotationally driving the grinder 22 in this condition, the back surface 13 of the semiconductor wafer W is ground.

During the back surface grinding of the semiconductor wafer W, microwaves are constantly directed from the microwave oscillator 226 toward the vicinity of the upper surface of the grinding pad 25A. Since the upper surface of the grinding pad 25A is an irregular surface into which abrasive grains and the like are buried, the microwaves directed from the microwave oscillator 226 are also distributed between the upper surface of the grinding pad 25A and the back surface 13 of the semiconductor wafer W.

When the back surface grinding of the semiconductor wafer W is so advanced that, as shown in FIG. 8C, the surface of the semiconductor wafer W subject to the grinding by the grinding pad 25A (grinder 22) reaches the grooves 12, the grooves 12 appear in the back surface 13 of the semiconductor wafer W, and come into a state of penetrating the semiconductor wafer W from its surface to the back surface. Then, the microwaves that have entered between the upper surface of the grinding pad 25A and the back surface 13 of the semiconductor wafer W enter into the double coated tape TB through the grooves 12, and after passing through the double coated tape TB, the microwaves enter into the microwave detecting devices 227 located in the bottom surface of the wafer head 21. The microwave detecting devices 227 then detect the microwaves that have been directed from the microwave oscillator 226 and have passed through the grooves 12, based on which the control part 30 detects the arrival of the surface of the semiconductor wafer W subject to grinding at the grooves 12.

Subsequently, when a prescribed time elapses after the detection of the arrival of the surface of the semiconductor wafer W subject to grinding at the grooves 12, the wafer head 21 is raised, followed by stopping of the rotation of the wafer head 21 together with stopping of the rotation of the grinder 22. The back surface grinding process is thus finished and separate pieces of the semiconductor chips C with a desired thickness are obtained.

As mentioned above, according to this embodiment, microwaves passing through the grooves 12 are detected by the microwave detecting devices 227 disposed in the wafer head 21, and based on the detection, the arrival of the surface of the semiconductor wafer W subject to grinding at the grooves 12 is detected. Also in this embodiment, the back surface grinding of the semiconductor wafer W by the grinder 22 is finished when a prescribed time elapses after the arrival of the surface of the semiconductor wafer W subject to grinding at the grooves 12 is detected. This enables the backsurface grinding of the semiconductor wafer W to be always finished with almost constant timing, and therefore prevents the amount of the semiconductor wafer W to be ground from varying, whereby the thickness of the semiconductor chips C obtained from this back surface grinding can be maintained to be almost constant.

In addition, the back surface 13 of the semiconductor wafer W is ground so as to be divided into the semiconductor chips C after the grooves 12 are cut in the semiconductor wafer W by dicing. This prevents generation of cracks and chips in the semiconductor chips C during the dicing, and enables production of very thin semiconductor chips C with a thickness of 50 $\mu$m or less in good order.

Meanwhile, it is preferable to arrange many microwave detecting devices 227 to be distributed in the bottom surface of the wafer head 21 by, for example, making the diameter of the loop antenna to be 10 mm or less, so that evenness of the grinding within the back surface of the semiconductor wafer W can be monitored.

In addition, when all the microwave detecting devices 227 are arranged so as to be located above the grooves 12 provided in the front surface 11 of the semiconductor wafer W, it is preferable to determine that the surface of the semiconductor wafer W subject to grinding has reached the grooves 12 in response to the detection of microwaves by all of the microwave detecting devices 227. In this way, the appearance of the whole area of the grooves 12 can be precisely detected, and inconvenience such as the case where the semiconductor wafer W cannot properly be divided into the semiconductor chips C due to insufficient grinding can surely be prevented from arising.

However, since the pattern of the grooves cut in the front surface 11 of the semiconductor wafer W varies depending on the contour (size) of the desired semiconductor chips, all the microwave detecting devices 227 disposed in the wafer head 21 are not necessarily located above the grooves 12. That is, it is possible to anticipate that only a part of the prescribed number of the microwave detecting devices 227 is located above the grooves 12. In such a case, the judgment that the surface of the semiconductor wafer W subject to grinding has reached the grooves 12 may be made in response to the detection of the microwaves by a predetermined number of the microwave detecting devices 227.

Furthermore, although the microwave oscillator 226 may be one that directs microwaves of a certain frequency, it should preferably be one that permits variable setting of the oscillation frequency of microwaves. In such a case, for example, the oscillation frequency of microwaves is set to be relatively high by the control section 30 at the time of initiating back surface grinding of the semiconductor wafer W so that the microwaves can pass when short slits are formed. After a microwave is detected by any of the microwave detection devices 227, the control part 30 controls the oscillation frequency of microwaves so that it lowers as the back surface grinding proceeds. The lengths of the grooves 12 that have appeared in the back surface 13 of the semiconductor wafer W by the grinding can therefore be detected. This makes it possible to more precisely judge the time when the entire lengths of the grooves 12 appear in the back surface 13 of the semiconductor wafer W, as well as to precisely monitor the evenness of the grinding within the back surface of the semiconductor wafer W.

In the meantime, the lowest frequency of microwaves directed from the microwave oscillator 226 should be set as follows: when a plurality of grooves 12 is cut in the form of a grid in the surface of a semiconductor wafer W, and the length of the shortest one of the grooves 12 is represented by L, the frequency should preferably be one that satisfies $L > \lambda/4$, where $\lambda$ is the wavelength of the microwaves.

Figure 9:
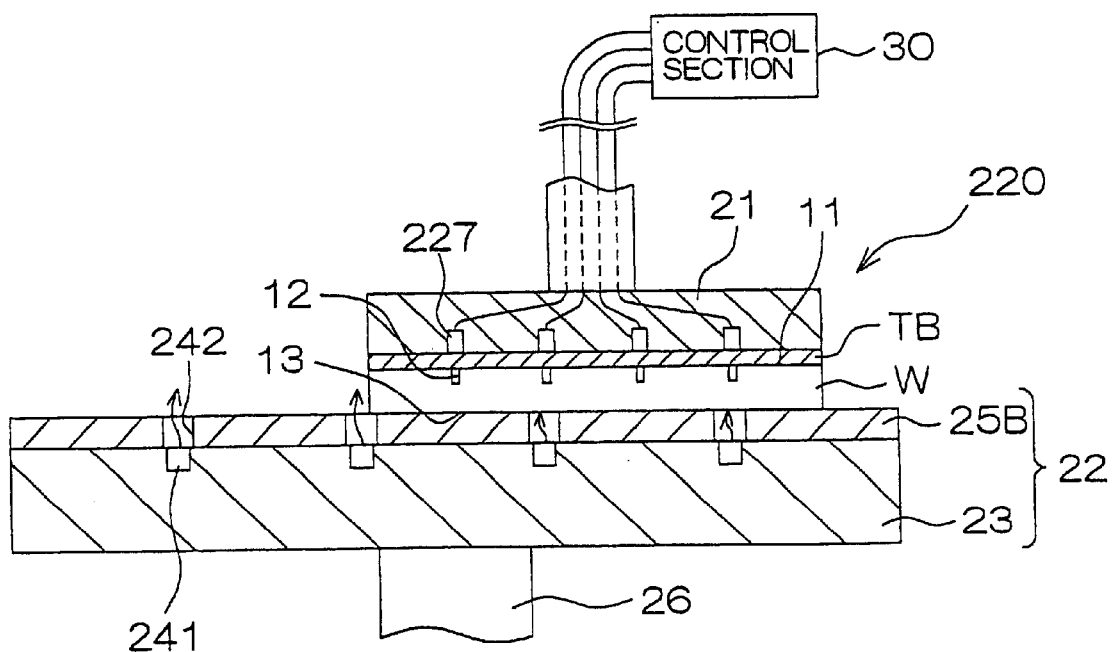
FIG. 9 is a diagrammatical sectional view showing another example of the construction of the grinding machine.
Figure 10:
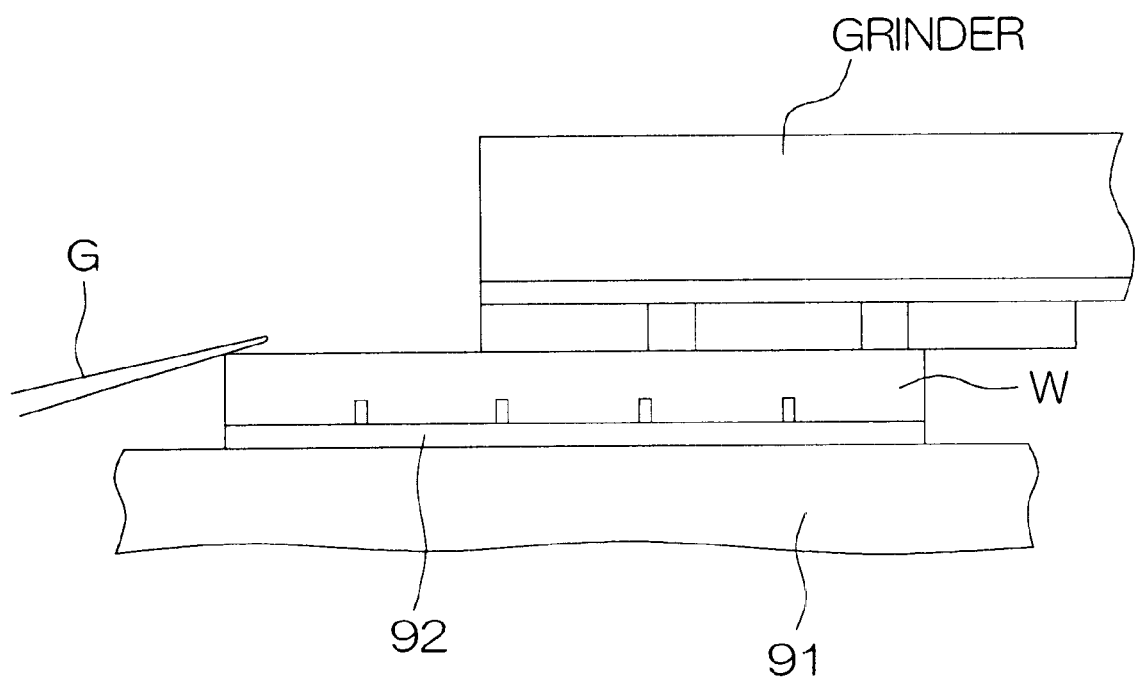
FIG. 10 is a view for illustrating a technique adoptable for detecting an end point of back surface grinding of a semiconductor wafer.

Furthermore, as shown in FIG. 9, it is also possible to arrange a prescribed number (one or plural number) of microwave oscillators 241 in the upper surface of a surface plate 23, while forming microwave passage holes 242 in a grinding pad 25B at positions corresponding to those of the microwave oscillators 241 so that the microwaves that have been directed from the microwave oscillators 241 and have passed through the microwave passage holes 242 and the grooves 12 are detected by microwave detecting devices 227 disposed in the bottom surface of the wafer head 21. Also, contrary to this, the microwave oscillators may be located in the wafer head 21 with the microwave detecting devices being located in the grinder 22 so that the microwave detecting devices 227 detect the microwaves that have been directed from the microwave oscillator and have passed through the microwave passage holes 242 and the grooves 12.

Incidentally, although the grinder 22 is disposed opposedly below the wafer head 21 in the first, second, and third embodiments mentioned above, it is possible to reverse the locations of the wafer head and the grinder so that the grinder 22 is disposed with its grinding surface being directed downward, and the wafer head 21 is disposed opposedly below the grinder 22 with the semiconductor wafer W being mounted on the side of the wafer head 21 facing the grinder 22.

Also, unlike in the first, second, and third embodiments in which the grinder 22 is larger than the semiconductor wafer W (wafer head 21) in plan view, the size of the grinder 22 may be approximately the same as or smaller than the size of the semiconductor wafer W in plan view.

Although the invention has been specifically described in certain preferred embodiments, it is to be understood that such embodiments are some of specific examples used only for disclosing the technical features of this invention, and that this invention is not limited to those examples but rather be construed within its spirit and scope as set out in the accompanying claims.

This application corresponds to Japanese Patent Applications Nos. 11-314086, 11-314087, and 11-314088 filed in the Japanese Patent Office on Nov. 4, 1999, and all of the disclosures in those applications are incorporated hereinto by reference.

What is claimed is:

1. A method of producing a semiconductor device by dividing a semiconductor wafer into separate pieces of semiconductor chips, the method comprising:
    (a) a groove formation process for forming a groove with a pattern according to an outer contour of a semiconductor chip in a front surface of a semiconductor wafer;
    (b) a process following the groove forming process for holding the semiconductor wafer by a wafer holding mechanism;
    (c) a back surface grinding process for grinding, with a grinder, a back surface of the semiconductor wafer held by the wafer holding mechanism; and
    (d) a finish timing determining process for detecting opening of a bottom face of the groove during the back surface grinding process and determining timing for finishing the back surface grinding process based on a result of the detection.

2. A method of producing a semiconductor device by dividing a semiconductor wafer into separate pieces of semiconductor chips, the method comprising:
    (a) a groove formation process for forming a groove with a pattern according to an outer contour of a semiconductor chip in a front surface of a semiconductor wafer;
    (b) a process following the groove forming process for holding the semiconductor wafer by a wafer holding mechanism;
    (c) a back surface grinding process for grinding, with a grinder, a back surface of the semiconductor wafer held by the wafer holding mechanism; and
    (d) a finish timing determining process for detecting opening of a bottom face of the groove during the back surface grinding process and determining timing for finishing the back surface grinding process based on a result of the detection,
        wherein the finish timing determining process includes a process for detecting an electromagnetic wave passing through the groove during the back surface grinding process.

3. The method according to claim 2, wherein the electromagnetic wave includes light.

4. A method of producing a semiconductor device by dividing a semiconductor wafer into separate pieces of semiconductor chips, the method comprising:
    (a) a groove formation process for forming a groove with a pattern according to an outer contour of a semiconductor chip in a front surface of a semiconductor wafer;
    (b) a process following the groove forming process for holding the semiconductor wafer by a wafer holding mechanism;
    (c) a back surface grinding process for grinding, with a grinder, a back surface of the semiconductor wafer held by the wafer holding mechanism; and
    (d) a finish timing determining process for detecting opening of a bottom face of the groove during the back surface grinding process and determining timing for finishing the back surface grinding process based on a result of the detection,
        wherein the finish timing determining process includes a process for detecting an electromagnetic wave passing through the groove during the back surface grinding process and the electromagnetic wave includes microwave.

5. A method of producing a semiconductor device by dividing a semiconductor wafer into separate pieces of semiconductor chips, the method comprising:
  (a) a groove formation process for forming a groove with a pattern according to an outer contour of a semiconductor chip in a front surface of a semiconductor wafer;
  (b) a process following the groove forming process for holding the semiconductor wafer by a wafer holding mechanism;
  (c) a back surface grinding process for grinding, with a grinder, a back surface of the semiconductor wafer held by the wafer holding mechanism; and,
  (d) a finish timing determining process for detecting opening of a bottom face of the groove during the back surface grinding process and determining timing for finishing the back surface grinding process based on a result of the detection,
  wherein the finish timing determining process includes an air sucking process for sucking air inside the groove during the back surface grinding process, an air pressure monitoring process for detecting and monitoring air pressure inside the groove during the air sucking process and a finish timing determining process for the determining timing for finishing the back surface grinding process based on the air pressure detected during the air pressure monitoring process.

* * * * *